(12) United States Patent
Chu et al.

(10) Patent No.: US 11,063,010 B2
(45) Date of Patent: Jul. 13, 2021

(54) REDISTRIBUTION LAYER (RDL) STRUCTURE AND METHOD OF MANUFACTURING THE SAME

(71) Applicant: Winbond Electronics Corp., Taichung (TW)

(72) Inventors: Yen-Jui Chu, Taichung (TW); Jin-Neng Wu, Taichung (TW); Hsin-Hung Chou, Taichung (TW); Chun-Hung Lin, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/264,684

(22) Filed: Feb. 1, 2019

(65) Prior Publication Data

US 2020/0251434 A1 Aug. 6, 2020

(51) Int. Cl.
*H01L 23/00* (2006.01)

(52) U.S. Cl.
CPC .............. *H01L 24/13* (2013.01); *H01L 24/03* (2013.01); *H01L 24/05* (2013.01); *H01L 24/11* (2013.01);
(Continued)

(58) Field of Classification Search
CPC ....... H01L 2924/00014; H01L 2924/00; H01L 2224/32225; H01L 2924/00012; H01L 2224/73204; H01L 2924/181; H01L 2224/16225; H01L 2924/014; H01L 2924/12042; H01L 2224/48227; H01L 2224/73265; H01L 2224/97; H01L 2224/2919; H01L 2224/32145; H01L 2924/15311; H01L 24/16; F28D 15/0233; F28D 15/0275; F28D 15/046; F28D 15/04; F28D 15/0266; F28D 15/0283; F28D 2021/0029; G02B 1/04; G02B 6/3865

See application file for complete search history.

(56) References Cited

U.S. PATENT DOCUMENTS 6,287,893 B1 9/2001 Elenius et al.
6,400,021 B1 6/2002 Cho
(Continued)

FOREIGN PATENT DOCUMENTS

| CN | 104253053 | 12/2014 |
|----|-----------|---------|
| CN | 106209409 | 12/2016 |
| KR | 100447968 | 9/2004 |

OTHER PUBLICATIONS

"Office Action of Taiwan Counterpart Application," dated Mar. 26, 2019, p. 1-p. 5.
(Continued)

*Primary Examiner* — Robert G Bachner
(74) *Attorney, Agent, or Firm* — JCIPRNET

(57) ABSTRACT

Provided is a redistribution layer (RDL) structure including a substrate, a pad, a dielectric layer, a self-aligned structure, a conductive layer, and a conductive connector. The pad is disposed on the substrate. The dielectric layer is disposed on the substrate and exposes a portion of the pad. The self-aligned structure is disposed on the dielectric layer. The conductive layer extends from the pad to conformally cover a surface of the self-aligned structure. The conductive connector is disposed on the self-aligned structure. A method of manufacturing the RDL structure is also provided.

14 Claims, 4 Drawing Sheets

(52) U.S. Cl.
CPC .............................. *H01L 2224/024* (2013.01); *H01L 2224/0239* (2013.01); *H01L 2224/02311* (2013.01); *H01L 2224/02373* (2013.01); *H01L 2224/0401* (2013.01); *H01L 2224/13021* (2013.01); *H01L 2224/13024* (2013.01); *H01L 2924/01029* (2013.01); *H01L 2924/01047* (2013.01); *H01L 2924/069* (2013.01); *H01L 2924/07025* (2013.01)

(56) References Cited

U.S. PATENT DOCUMENTS

| | | |
|---|---|---|
| 2005/0035451 A1 | 2/2005 | Liu et al. |
| 2009/0294958 A1 | 12/2009 | Hu |
| 2012/0055702 A1 | 3/2012 | Rathburn |
| 2013/0187277 A1* | 7/2013 | Chen .................. H01L 24/13 257/762 |
| 2014/0374899 A1* | 12/2014 | Yang ................ H01L 23/49811 257/737 |
| 2015/0255406 A1* | 9/2015 | Miao .................. H01L 24/11 257/684 |
| 2016/0329244 A1* | 11/2016 | Chiao .................. H01L 25/50 |

OTHER PUBLICATIONS

Pascal Piera, "Aerosol Jet of 3D Printed Structural Electronics (3DPSE) for Redistribution(RDL), Wafer Level Packaging(WLP), Micro LED, QD LED and IoT Sensor.", SEMICON Taiwan 2017, Sep. 2017, pp. 1-42.

"Office Action of China Counterpart Application", dated Mar. 19, 2021, p. 1-p. 10.

\* cited by examiner

REDISTRIBUTION LAYER (RDL) STRUCTURE AND METHOD OF MANUFACTURING THE SAME

BACKGROUND

Technical Field

The disclosure relates to a semiconductor structure and a method of manufacturing the same, and more particularly to a redistribution layer (RDL) structure and a method of manufacturing the same.

Description of Related Art

Recently, the continuous increase in the integration of various electronic components (e.g., transistors, diodes, resistors, capacitors, and so on) leads to the rapid growth of the semiconductor industry. The increase in the integration mostly results from the continuous reduction of the minimum feature size, so that more components can be integrated into a given area.

Compared to the convention package structure, these electronic components with smaller size occupy smaller area and thus require a smaller package structure. For instance, a semiconductor chip or die has an increasing number of input/output (I/O) solder pads, and a redistribution layer (RDL) can redistribute the original I/O solder pads of the semiconductor chip or die to be located around the semiconductor chip or die, so as to increase the number of I/O solder pads.

However, in the conventional wafer level packaging process, due to the nearly planar structure of an under-ball metallurgy (UBM) layer, the contact area between the UBM layer and a solder ball is relatively small, and the bonding force therebetween is relatively weak, which further causes the solder ball to be peeled off or leads to an issue of intermetallic compounds (IMCs). Besides, the abnormal height of the solder ball may also cause the issue of cold joint or solder bridge during the packaging process.

SUMMARY

The disclosure provides a redistribution layer (RDL) structure including a substrate, a pad, a dielectric layer, a self-aligned structure, a conductive layer, and a conductive connector. The pad is disposed on the substrate. The dielectric layer is disposed on the substrate and exposes a portion of the pad. The self-aligned structure is disposed on the dielectric layer. The conductive layer extends from the pad to conformally cover a surface of the self-aligned structure. The conductive connector is disposed on the self-aligned structure.

The disclosure provides a method of manufacturing an RDL structure, and the method includes following steps. A pad is formed on a substrate. A dielectric layer is formed on the substrate. The dielectric layer has an opening exposing a portion of the pad. A self-aligned structure is formed on the dielectric layer by using a first three-dimensional (3D) printing technology. A conductive layer is formed by using a second 3D printing technology, and the conductive layer extends from the pad to conformally cover a surface of the self-aligned structure. A conductive connector is formed on the self-aligned structure.

In view of the above, the 3D printing technology is provided in the disclosure to form the self-aligned structure having the recess, so as to increase the contact area between the conductive layer conformally covering the self-aligned structure and the conductive connector embedded in the recess and prevent the conductive connector from being peeled off or cracked. Thereby, the structural strength between the conductive layer and the conductive connector in the RDL structure can be significantly improved according to one or more embodiments of the disclosure, and product reliability can be further improved. In addition, the method of manufacturing the RDL structure provided herein has simple manufacturing steps, thus enhancing commercial competitiveness of the product.

To make the above features and advantages described in one or more of the embodiments provided in the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles described herein.

DESCRIPTION OF THE EMBODIMENTS

Figure 1A:
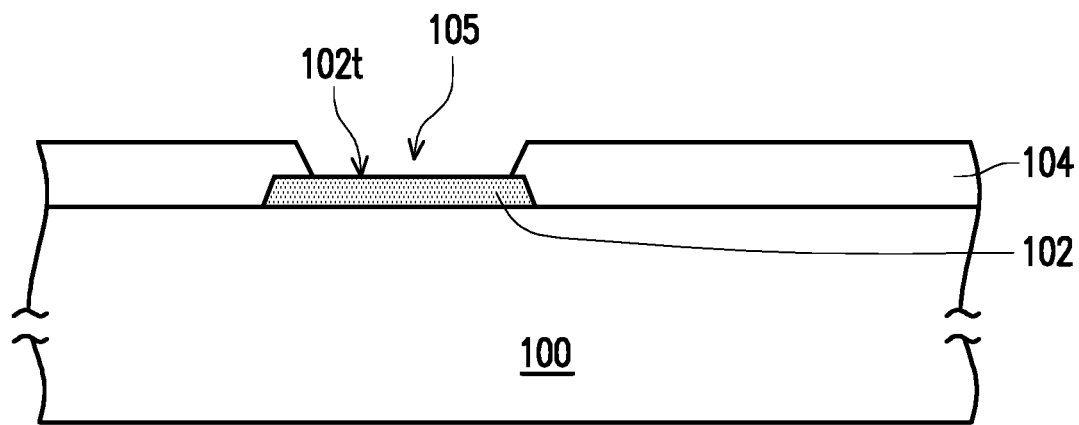
FIG. 1A to FIG. 1D are schematic cross-sectional views illustrating a manufacturing process of a redistribution layer (RDL) structure according to an embodiment of the disclosure.

The invention will be described in a more comprehensive manner with reference to the drawings of the embodiments. This invention, however, may be embodied in many different forms and should not be construed as limited to the embodiments set forth herein. The thickness of layers and regions in the drawings may be exaggerated for clarity. The same or similar reference numbers used in the embodiments represent the same or similar devices. Accordingly, no further description thereof is provided hereinafter.

Figure 2:
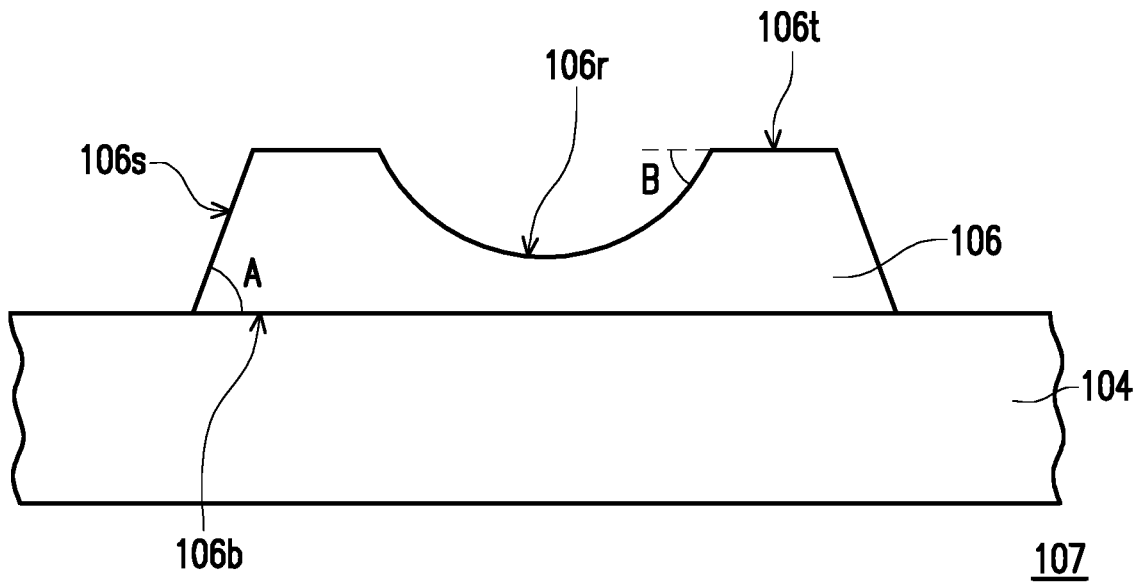
FIG. 2 is an enlarged cross-sectional view illustrating a portion of the RDL structure depicted in FIG. 1B.
Figure 3:
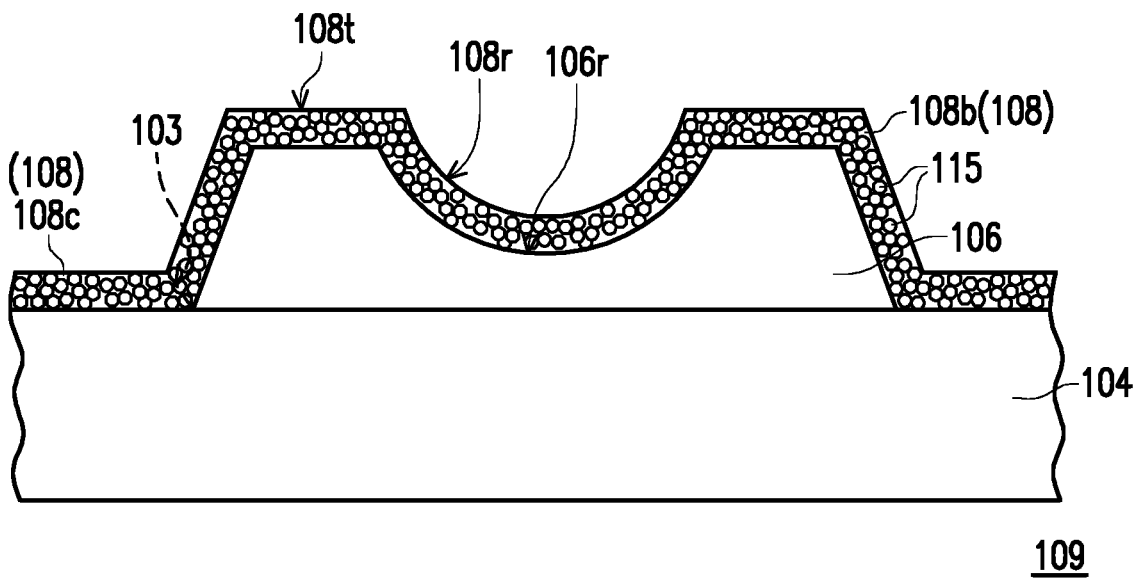
FIG. 3 is an enlarged cross-sectional view illustrating a portion of the conductive layer depicted in FIG. 1C.
Figure 4:
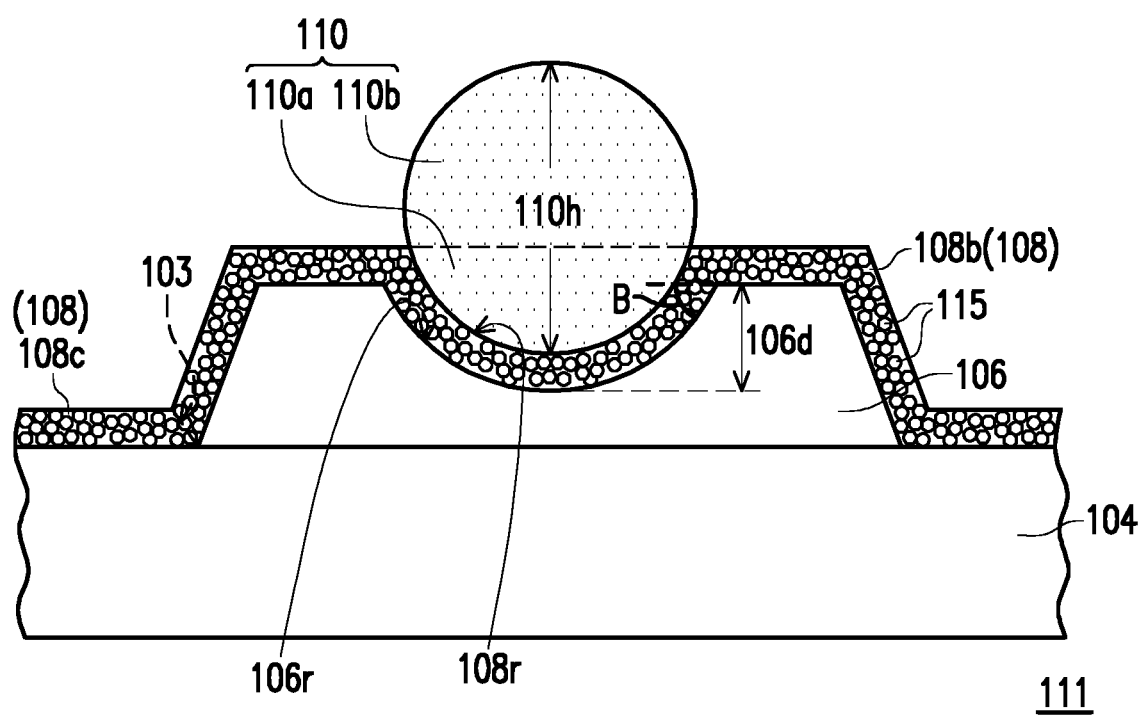
FIG. 4 is an enlarged cross-sectional view illustrating a portion of the RDL structure depicted in FIG. 1D.

FIG. 1A to FIG. 1D are schematic cross-sectional views illustrating a manufacturing process of a redistribution layer (RDL) structure according to an embodiment of the disclosure. FIG. 2 is an enlarged cross-sectional view illustrating a portion of the RDL structure depicted in FIG. 1B. FIG. 3 is an enlarged cross-sectional view illustrating a portion of the conductive layer depicted in FIG. 1C. FIG. 4 is an enlarged cross-sectional view illustrating a portion of the RDL structure depicted in FIG. 1D.

With reference to FIG. 1A, a method of manufacturing am RDL structure includes following steps. Firstly, a substrate 100 is provided. According to an embodiment, the substrate 100 includes a semiconductor material. In particular, the substrate 100 may be made of at least one semiconductor material selected from the group consisting of Si, Ge, SiGe, GaP, GaAs, SiC, SiGeC, InAs, and InP. In the present embodiment, the substrate 100 may be, for example, a silicon substrate. Besides, the substrate 100 may also include a silicon on insulator (SOI) substrate. In FIG. 1A, no device is disposed in the substrate 100; however, the substrate 100 provided in the present embodiment may be equipped with active devices (e.g., a transistor, a diode, and so on), passive devices (e.g., a capacitor, an inductor, a resistor, and so on), or a combination thereof. In other embodiments, the substrate 100 may be equipped with logic devices, memory devices, or a combination thereof.

A pad 102 is then formed on the substrate 100. According to an embodiment, the material of the pad 102 includes a metallic material, such as copper, aluminum, gold, silver, nickel, palladium, or a combination thereof. A method of forming the pad 102 includes physical vapor deposition (PVD), plating, or a combination thereof. FIG. 1A illustrates one pad 102, which should however not be construed as a limitation in the disclosure. In other embodiments, the number of the pad 102 may be adjusted according to actual demands. According to an embodiment, the pad 102 may be electrically connected to devices (not shown) in the substrate 100.

After that, a dielectric layer 104 is formed on the substrate 100. The dielectric layer 104 covers a sidewall of the pad 102 and one portion of a top surface of the pad 102. As shown in FIG. 1A, the dielectric layer 104 has an opening 105. The opening 105 exposes another portion of a top surface 102t of the pad 102. According to an embodiment, the material of the dielectric layer 104 includes a dielectric material, such as silicon oxide, silicon nitride, silicon oxynitride, polyimide, or a combination thereof. A method of forming the dielectric layer 104 includes PVD, chemical vapor deposition (CVD), or a combination thereof.

Figure 1B:
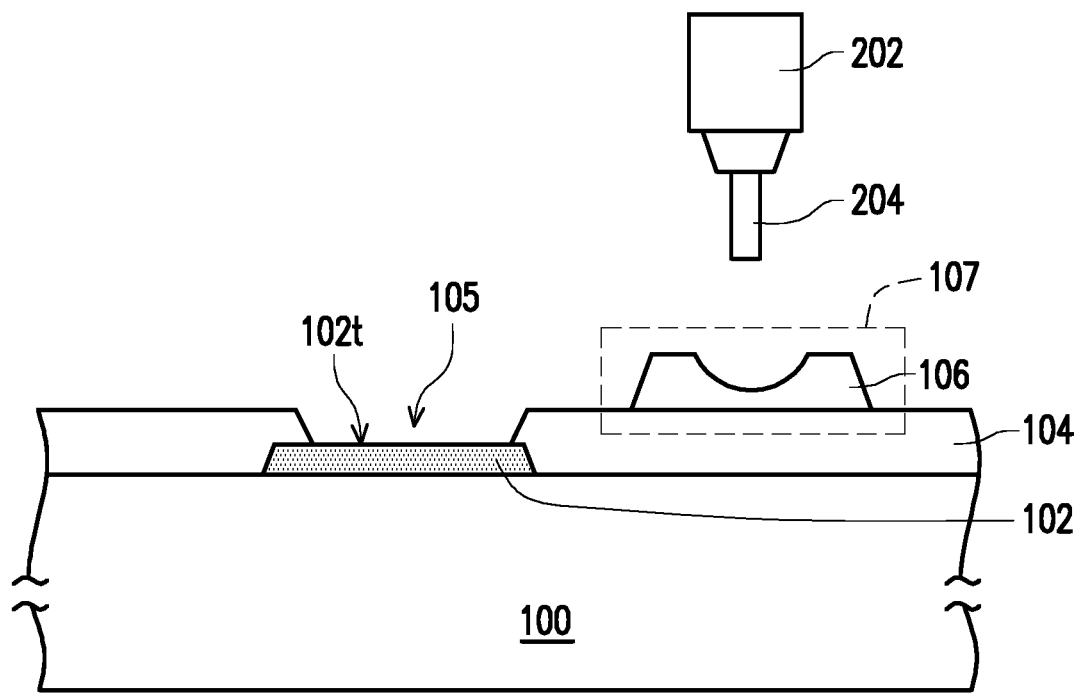

With reference to FIG. 1B, the self-aligned structure 106 is formed by using a 3D printing technology. According to an embodiment, the 3D printing technology includes an ink jet printing process, an aerosol jet printing process, or a combination thereof. The aerosol jet printing process is taken as an example, wherein an aerosol jet deposition head is applied to form an annularly propagating jet constituted by an outer sheath flow and an inner aerosol-laden carrier flow. During the aerosol jet printing process, an aerosol stream of the to-be-deposited materials is concentrated and deposited onto a surface to be formed. Said step may be referred to as maskless mesoscale material deposition (M3D), i.e., the deposition step can be performed without using any mask.

In the present embodiment, as shown in FIG. 1B, the nozzle 202 of the 3D printing apparatus is applied to eject an insulation ink 204 onto the dielectric layer 104. According to an embodiment, the insulation ink 204 includes an insulation material and a solvent. For instance, the insulation material may be polyimide, polyurethane (PU), or the like. The solvent may be N-Methyl-2-pyrrolidone (NMP), propylene glycol monomethyl ether (PGME), ethylene glycol, or the like. After a curing step is performed, the insulation ink 204 is cured and becomes the self-aligned structure 106. In an alternative embodiment, the curing step includes a heating step or an irradiating step for volatilizing the solvent in the insulation ink 204 and curing the insulation ink 204. According to an embodiment, the self-aligned structure 106 includes an insulation compound, such as polyimide, PU, SU-8, an adhesive, or a combination thereof. Only one self-aligned structure 106 is illustrated in FIG. 1B, however, the invention is not limited thereto. In other embodiments, the number of the self-aligned structure 106 may be adjusted according to actual demands.

To be specific, with reference to the enlarged view 2 of a portion 107 of the self-aligned structure 106 of FIG. 1B, the self-aligned structure 106 includes a top surface 106t and a bottom surface 106b opposite to each other as well as a sidewall 106s extending to connect the top surface 106t and the bottom surface 106b. The top surface 106t of the self-aligned structure 106 further has a recess 106r. According to an embodiment, as shown in FIG. 2, the recess 106r may be an arc-shaped surface recessed in an extension direction from the top surface 106t toward the bottom surface 106b. However, the invention is not limited thereto; in other embodiments, the recess 106r may also be a U-shaped surface, a V-shaped surface, or a surface of any other shape and may be recessed in the extension direction from the top surface 106t toward the bottom surface 106b.

Besides, as shown in FIG. 2, an included angle A between the sidewall 106s and the bottom surface 106b is less than 90 degrees. Namely, the sidewall of the self-aligned structure 106 is an inclined and tapered sidewall. When the included angle A is less than 90 degrees, the adhesion between the self-aligned structure 106 and the underlying dielectric layer 104 can be enhanced, and the included angle A also contributes to stress absorption. The included angle A depicted in FIG. 2 is less than 90 degrees, which should however not be construed as a limitation in the disclosure; in other embodiments, the included angle A may also be equal to or greater than 90 degrees. On the other hand, there is a shear angle B between an extension plane of the top surface 106t and the arc-shaped surface of the recess 106r. According to the present embodiment, the shear angle B may be changed to adjust the size and the height of the subsequently formed conductive connector 110 (as shown in FIG. 1D). In an embodiment, the included angle A may be from 30 degrees to 70 degrees, while the shear angle B may be from 20 degrees to 40 degrees.

Figure 1C:
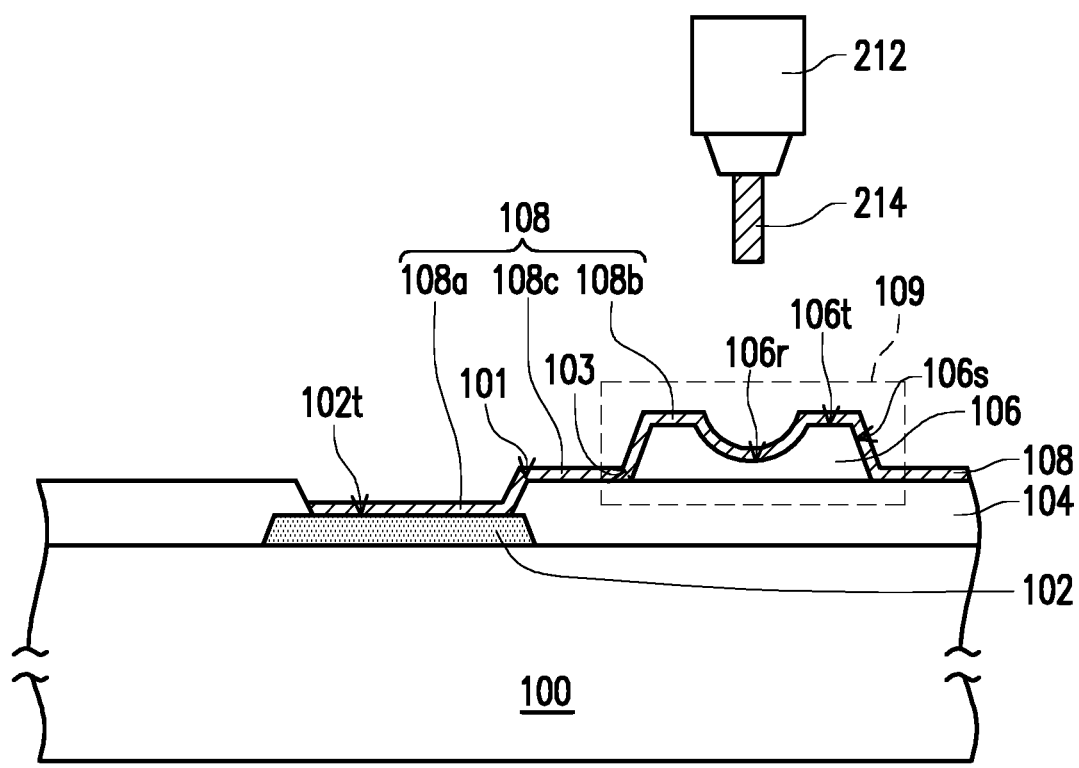
Figure 1D:
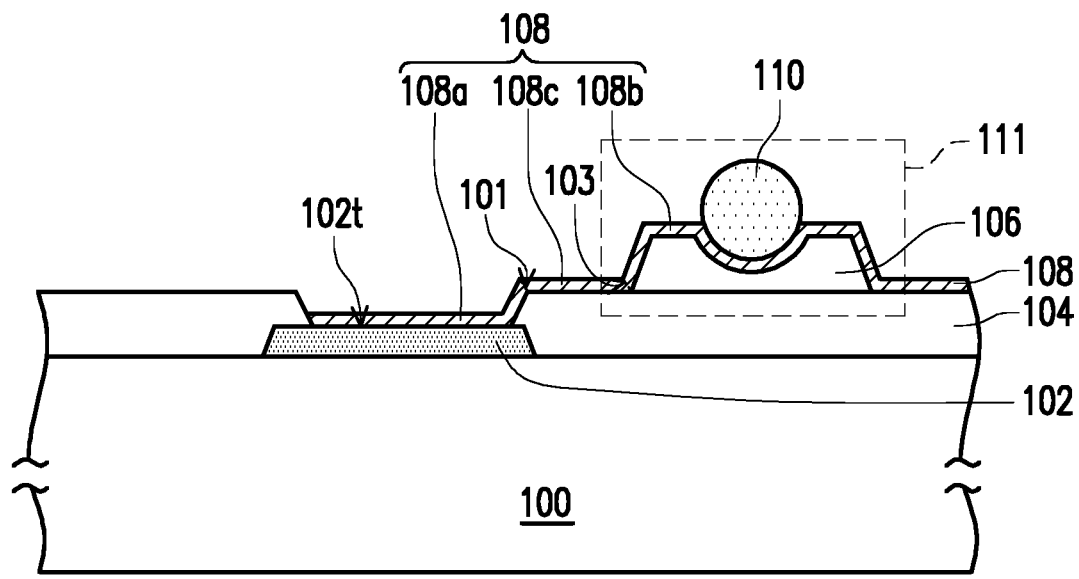

With reference to FIG. 1C, the conductive layer 108 is formed by using the 3D printing technology. Specifically, the nozzle 212 of the 3D printing apparatus is applied to eject a conductive ink 214 onto the pad 102, the dielectric layer 104, and the self-aligned structure 106, so as to form the conductive layer 108. In this case, as shown in FIG. 1C, the conductive layer 108 extends from the pad 102 to conformally cover a surface of the self-aligned structure 106. Particularly, the conductive layer 108 may include a first portion 108a, a second portion 108b, and a third portion 108c. The first portion 108a conformally covers and contacts the top surface 102t of the pad 102. The second portion 108b conformally covers and contacts the top surface 106t, the recess 106r, and the sidewall 106s of the self-aligned structure 106. The third portion 108c is located between the first portion 108a and the second portion 108b to connect the first portion 108a and the second portion 108b. According to an embodiment, the first portion 108a may be considered as an original input/output (I/O) pad, so as to perform chip probing (CP), which is referred to as a test solder pad 108a hereinafter. The second portion 108b may be considered as a re-routed RDL pad on which the conductive connector 110 (as shown in FIG. 1D) is formed, so as to be electrically connected to external circuits or components. The second portion 108b is referred to an RDL solder pad 108b hereinafter. The third portion 108c may be considered as a trace connecting the test solder pad 108a and the RDL solder pad 108b.

In another embodiment, a minimum thickness of the conductive layer 108 may be from 0.5 μm to 5 μm, which should however not be construed as a limitation in the disclosure; in other embodiments, the thickness of the conductive layer 108 may be increased by a printing build-up method.

According to an embodiment, the conductive ink 214 includes a plurality of conductive particles 115 and a solvent. The solvent includes NMP, PGME, ethylene glycol, or the like. To be specific, with reference to the enlarged view 3 of a portion 109 of the conductive layer 108 of FIG. 1C, after the curing step is performed, the conductive layer 108 is constituted by a plurality of conductive particles 115 contacting each other. According to an embodiment, the conductive particles 115 include a plurality of metal nanoparticles, e.g., silver nanoparticles, copper-silver nanoparticles, copper nanoparticles, or a combination thereof. According to another embodiment, an average diameter of the conductive particles 115 may be from 5 nm to 1 µm. Standard deviation of particle diameter distribution of the conductive particles 115 may be from 4.5 to 43. In some embodiments, the conductive layer 108 is formed by the ball-shaped conductive particles 115 which are tightly connected, so as to achieve the effect of uniform electrical conductivity. In other embodiments, the conductive particles 115 may each have different diameters.

On the other hand, as shown in FIG. 1C and FIG. 3, the test solder pad 108a, the RDL solder pad 108b, and the trace 108c therebetween share one or more of the conductive particles 115. That is, one portion of the conductive particles 115 crosses a virtual interface 101 between the test solder pad 108a and the trace 108c, and another portion of the conductive particles 115 crosses a virtual interface 103 between the trace 108c and the RDL solder pad 108b. Note that there is no actual interface between the test solder pad 108a and the trade 108c nor between the trace 108c and the RDL solder pad 108b. The virtual interfaces 101 and 103 herein are provided to clearly define that the test solder pad 108a, the RDL solder pad 108b, and the trace 108c are integrally formed. The so-called "integrally formed" may be considered as being formed in the same manufacturing process with use of the same material. For instance, the test solder pad 108a, the RDL solder pad 108b, and the trace 108c are formed by applying the same 3D printing technology with use of the same conductive ink 214. Hence, the RDL solder pad 108b provided in the present embodiment can prevent the issue of IMC cracks compared to the conventional UBM layer, so that the product reliability can be improved.

Additionally, since the conductive layer 108 conformally covers the surface of the self-aligned structure 106, the RDL solder pad 108b of the conductive layer 108 also replicates the shape of the recess 106r of the self-aligned structure 106 and thus has another recess 108r. According to an embodiment, as shown in FIG. 3, the recess 108r may be an arc-shaped surface recessed in an extension direction from the top surface 108t toward the dielectric layer 104, which should however not be construed as a limitation in the disclosure; in other embodiments, the recess 108r may also be a U-shaped surface, a V-shaped surface, or a surface of any other shape and may be recessed in the extension direction from the top surface 106t toward the dielectric layer 104.

With reference to FIG. 1D, the conductive connector 110 is formed on the self-aligned structure 106. Specifically, the conductive connector 110 may be formed with a desired bump shape by performing a reflow step after a layer of solder material is formed on the recess 106r of the self-aligned structure 106 through, for instance, evaporation, plating, printing, solder transfer, ball placement, and so on. In some embodiments, the material of the conductive connector 110 includes a conductive material, which may be, for instance, a solder material, copper, aluminum, gold, nickel, silver, palladium, tin, and so on. According to the present embodiment, as shown in FIG. 1D, the conductive connector 110 may be a solder ball.

Note that the self-aligned structure 106 has the recess 106r, and therefore the conductive connector 110 is able to be self-aligned or positioned into the recess 106r. In this case, as shown in an enlarged view 4 of a portion 111 of the RDL depicted in FIG. 1D, a lower portion 111a of the conductive connector 110 is embedded in the recess 108r of the conductive layer 108 (or the recess 106r of the self-aligned structure 106), while an upper portion 111b of the conductive connector 110 is exposed by the recess 108r of the conductive layer 108 (or the recess 106r of the self-aligned structure 106). The recess 108r of the conductive layer 108 is located between the recess 106r of the self-aligned structure 106 and the conductive connector 110. According to an embodiment, a depth 106d of the recess 106r of the self-aligned structure 106 may be from one third to one fourth of a height 110h of the conductive connector 110. In comparison with the conventional UBM layer, the contact area between the conductive layer 108 and the conductive connector 110 provided in the present embodiment is relatively large, so as to significantly improve the structural strength between the conductive layer 108 and the conductive connector 110, and product reliability can be further improved. Besides, according to the present embodiment, the size and the height of the conductive connector 110 may be adjusted by changing the shear angle B and the depth 106d of the recess 106r. For instance, the greater the depth 106d of the recess 106r and the greater the shear angle B, the more the lower portion 110a of the conductive connector 110 embedded in the recess 106r. Under said circumstances, the ball height of the upper portion 110b of the conductive connector 110 is reduced. Conversely, the ball height of the upper portion 110b of the conductive connector 110 is increased. Accordingly, the issue of cold joint or solder bridge resulting from the abnormal ball height can be prevented in the present embodiment.

In addition, the RDL structure and the UBM layer are formed by repeatedly performing processes of sputtering, plating, lithography, etching, and the like in the conventional packaging process; by contrast, according to the present embodiment, the conductive layer 108 (including the test solder pad 108a, the RDL solder pad 108b, and the trace 108c) is formed by applying the 3D printing technology, thus simplifying the manufacturing steps to reduce manufacturing costs and increase the commercial competitiveness of the resultant product.

To sum up, the 3D printing technology is provided in the disclosure to form the self-aligned structure having the recess, so as to increase the contact area between the conductive layer conformally covering the self-aligned structure and the conductive connector embedded in the recess. Thereby, the structural strength between the conductive layer and the conductive connector in the RDL structure can be significantly improved according to one or more embodiments of the disclosure, and product reliability can be further improved. In addition, the method of manufacturing the RDL structure provided herein has simple manufacturing steps, thus enhancing commercial competitiveness of the product.

Although exemplary embodiments of the disclosure have been described in detail above, the disclosure is not limited to specific embodiments, and various modifications and changes may be made within the scope of the disclosure defined in the claims.

What is claimed is:

1. A redistribution layer structure, comprising:
a pad, disposed on a substrate;
a dielectric layer, disposed on the substrate and exposing a portion of the pad;
a self-aligned structure, disposed on the dielectric layer, wherein the self-aligned structure and the pad are separated from each other, the self-aligned structure has a top surface and a bottom surface opposite to each other, the top surface is further away from the dielectric layer than the bottom surface;
a conductive layer, extending from the pad to conformally cover the top surface of the self-aligned structure, wherein the conductive layer comprises:
a first portion contacting a top surface of the pad;
a second portion contacting the top surface of the self-aligned structure; and
a third portion disposed between the first and second portions, and contacting a surface of the dielectric layer exposed by the self-aligned structure; and
a conductive connector, disposed on the self-aligned structure.

2. The redistribution layer structure as recited in claim 1, wherein the top surface of the self-aligned structure has a recess.

3. The redistribution layer structure as recited in claim 2, wherein the self-aligned structure comprises a sidewall extending to connect the top surface and the bottom surface, and an included angle between the sidewall and the bottom surface is less than 90 degrees.

4. The redistribution layer structure as recited in claim 2, wherein a portion of the conductive connector is embedded in the recess of the self-aligned structure, and a portion of the conductive layer is located between the recess of the self-aligned structure and the conductive connector.

5. The redistribution layer structure as recited in claim 2, wherein a depth of the recess of the self-aligned structure is from one third to one fourth of a height of the conductive connector.

6. The redistribution layer structure as recited in claim 1, wherein the conductive layer is constituted by a plurality of conductive particles contacting each other, the plurality of conductive particles comprise a plurality of metal nanoparticles, and the plurality of metal nanoparticles comprise silver nanoparticles, copper-silver nanoparticles, copper nanoparticles, or a combination thereof.

7. The redistribution layer structure as recited in claim 1, wherein the self-aligned structure comprises an insulation polymer, and the insulation polymer comprises polyimide, polyurethane, SU-8, an adhesive, or a combination thereof.

8. The redistribution layer structure as recited in claim 3, wherein the second portion of the conductive layer conformally covers and contacts the top surface, the recess, and the sidewall of the self-aligned structure.

9. The redistribution layer structure as recited in claim 1, wherein the first portion, the second portion, and the third portion of the conductive layer are located at different level heights above the substrate with respect to each other.

10. The redistribution layer structure as recited in claim 1, wherein
the self-aligned structure further comprises a sidewall extending to connect the top surface and the bottom surface of the self-aligned structure,
the dielectric layer includes an opening exposing the portion of the pad,
and the third portion of the conductive layer extends from the opening of the dielectric layer to the sidewall of the self-aligned structure.

11. The redistribution structure as recited in claim 1, wherein the self-aligned structure exposes a region of the dielectric layer covering a sidewall of the pad and one portion of a top surface of the pad.

12. A method of manufacturing a redistribution layer structure, comprising:
forming a pad on a substrate;
forming a dielectric layer on the substrate, the dielectric layer having an opening exposing a portion of the pad;
forming a self-aligned structure on the dielectric layer by using a first 3D printing technology, wherein the self-aligned structure and the pad are separated from each other, and the self-aligned structure has a top surface and a bottom surface opposite to each other, the top surface is further away from the dielectric layer than the bottom surface;
forming a conductive layer by using a second 3D printing technology, the conductive layer extending from the pad to conformally cover the top surface of the self-aligned structure, wherein the conductive layer comprises:
a first portion contacting a top surface of the pad;
a second portion contacting the top surface of the self-aligned structure; and
a third portion formed between the first and second portions, and contacting a surface of the dielectric layer exposed by the self-aligned structure; and
forming a conductive connector on the self-aligned structure.

13. The method of manufacturing the redistribution layer structure as recited in claim 12, wherein the top surface of the self-aligned structure has a recess, so that a portion of the conductive connector is embedded into the recess of the self-aligned structure.

14. The method of manufacturing the redistribution layer structure as recited in claim 12, wherein the forming the conductive layer by using the second 3D printing technology comprises using conductive ink, the conductive ink comprises a plurality of metal nanoparticles, and the plurality of metal nanoparticles comprise silver nanoparticles, copper-silver nanoparticles, copper nanoparticles, or a combination thereof.

* * * * *